United States Patent
Tachibana (10) Patent No.: US 8,364,478 B2
(45) Date of Patent: Jan. 29, 2013

(54) AUDIO SIGNAL PROCESSING APPARATUS, AUDIO SIGNAL PROCESSING METHOD, AND COMMUNICATION TERMINAL

(75) Inventor: Makoto Tachibana, Tokyo (JP)

(73) Assignee: Sony Mobile Communicatins Japan, Inc., Tokyo (JP)

( * ) Notice: Subject to any disclaimer, the term of this patent is extended or adjusted under 35 U.S.C. 154(b) by 1114 days.

(21) Appl. No.: 12/268,747

(22) Filed: Nov. 11, 2008

(65) Prior Publication Data

US 2009/0125303 A1    May 14, 2009

(30) Foreign Application Priority Data

Nov. 13, 2007    (JP) ................. P2007-293962

(51) Int. Cl.
*G10L 21/02*    (2006.01)
(52) U.S. Cl. ...... 704/226; 704/228; 704/229; 704/200.1; 381/106; 381/73.1; 381/17; 381/71.11; 381/98
(58) Field of Classification Search .......... 704/226–228, 704/229, 200.1; 381/1, 106, 17, 98, 71.11, 381/73.1, 108, 86, 27, 18, 19; 84/649, 609
See application file for complete search history.

(56) References Cited

U.S. PATENT DOCUMENTS

| | | | |
|---|---|---|---|
| 4,513,177 A | | 4/1985 | Nishino et al. |
| 4,715,063 A | | 12/1987 | Haddad et al. |
| 4,829,565 A | | 5/1989 | Goldberg |
| 4,866,405 A | * | 9/1989 | Endo et al. ............ 332/159 |
| 5,018,205 A | * | 5/1991 | Takagi et al. ............ 381/86 |
| 5,191,620 A | * | 3/1993 | Lee ............ 381/105 |
| 5,410,606 A | * | 4/1995 | Imai et al. ............ 381/71.14 |
| 5,724,416 A | * | 3/1998 | Foladare et al. ......... 379/202.01 |
| 5,737,719 A | | 4/1998 | Terry |
| 5,751,822 A | | 5/1998 | Yamaguchi et al. |
| 5,844,992 A | * | 12/1998 | Boyer ............ 381/57 |
| 5,850,453 A | * | 12/1998 | Klayman et al. ............ 381/1 |
| 6,584,201 B1 | * | 6/2003 | Konstantinou et al. ......... 381/57 |
| 2006/0014570 A1 | * | 1/2006 | Marx et al. ............ 455/569.1 |

FOREIGN PATENT DOCUMENTS

| | | |
|---|---|---|
| CN | 1390383 | 1/2003 |
| EP | 0 661 858 | 7/1995 |
| EP | 1 811 660 | 7/2007 |
| GB | 2 327 835 | 2/1999 |
| JP | 7 221832 | 8/1995 |
| JP | 2007-174011 | 7/2001 |
| JP | 2004-289614 | 10/2004 |
| JP | 2005-253097 | 9/2005 |
| WO | WO 93 20669 | 10/1993 |
| WO | WO 00/59110 | 10/2000 |
| WO | WO 02/15395 | 2/2002 |

* cited by examiner

*Primary Examiner* — Vijay B Chawan
(74) *Attorney, Agent, or Firm* — Frommer Lawrence & Haug LLP; William S. Frommer; Ellen Marcie Emas (57) ABSTRACT

An audio signal processing apparatus, includes an environmental ambient noise level detection unit for detecting an environmental ambient noise level contained in an audio signal inputted through sound collection means for collecting a transmission sound at the time of a voice call, a signal level adjustment unit which has a level adjustment function to adjust an output signal level with respect to an input signal level, and an input/output characteristic change function to change an input/output characteristic when adjusting a level in the level adjustment function by means of a control signal, and in which a received sound signal in the case of the telephone call voice is arranged to be an input signal, and a control signal generation unit for generating the control signal for changing the input/output characteristic of the signal level adjustment unit from the environmental ambient noise level detected by the environmental ambient noise level detection unit.

15 Claims, 11 Drawing Sheets

| CONTROL SIGNAL (dBfs) | VARIABLE HINGE POINT (INPUT_dB,OUTPUT_dB) |
|---|---|
| ~-40 | -20,-20 |
| -40~-35 | -20,-18.75 |
| -35~-30 | -20,-17.5 |
| -30~-25 | -20,-16.25 |
| -25~-20 | -20,-15 |
| -20~-15 | -20,-13.75 |
| -15~-108 | -20,-12.5 |
| -10~-5 | -20,-11.25 |
| -5~ | -5,-10 |

FIG. 19

| CONTROL SIGNAL (dBfs) | VARIABLE HINGE POINT (INPUT_dB,OUTPUT_dB) |
|---|---|
| ~-20 | -20,-20 |
| -20~-18 | -20,-19 |
| -18~-16 | -20,-18 |
| -16~-14 | -20,-17 |
| -14~-12 | -20,-16 |
| -12~-10 | -20,-15 |
| -10~-8 | -20,-14 |
| -8~-6 | -20,-13 |
| -6~-4 | -20,-12 |
| -4~-2 | -20,-11 |
| -2~0 | -20,-10 |

AUDIO SIGNAL PROCESSING APPARATUS, AUDIO SIGNAL PROCESSING METHOD, AND COMMUNICATION TERMINAL

BACKGROUND OF THE INVENTION

1. Field of the Invention

The present invention relates to an audio signal processing apparatus and an audio signal processing method for ease of listening to a received sound sent through communication networks, such as a mobile phone network, and a communication terminal, such as a mobile phone terminal etc., allowing a telephone call through voices.

2. Description of the Related Art

With respect to the case where a voice call is made through communication networks, such as a mobile phone network, there has been a technology of improving the ease of listening to a telephone call voice in an ambient noise environment by subjecting a telephone call voice signal on the receiver side to a predetermined signal process, for example.

For example, Japanese Patent Application Publication (KOKAI) No. H7-221832 (Patent Document 1) discloses a technology in which frequency characteristics of ambient noises and a received sound are compared and the frequency characteristic of the received sound are changed to improve the ease of listening.

SUMMARY OF THE INVENTION

However, in order that the frequency characteristics of the ambient noises and the received sound are compared to change the frequency characteristic of the received sound as described above, there is an issue that it is necessary to carry out signal analysis of both the ambient noise and the received sound and many processes, for example comparison among these resulting analyses, are needed, thus a burden is large for an apparatus whose throughput is limited, such as for example a mobile phone terminal.

The present invention is proposed in view of such conditions, and aims at providing an audio signal processing apparatus, an audio signal processing method, and a communication terminal, which allow the ease of listening to a telephone call voice (in particular received voice) with less throughput.

An audio signal processing apparatus of the present invention includes at least an environmental ambient noise level detection unit for detecting an environmental ambient noise level contained in an audio signal inputted through sound collection means for collecting a transmission sound at the time of a voice call, a level adjustment unit which has a level adjustment function to adjust an output signal level with respect to an input signal level, and an input/output characteristic change function to change an input/output characteristic when adjusting a level in the level adjustment function by means of a control signal, and further includes a signal level adjustment unit in which a received sound signal in the case of the telephone call voice is arranged to be an input signal, and a control signal generation unit for generating the control signal for changing the input/output characteristic of the signal level adjustment unit from the environmental ambient noise level, to thereby solve the above-described issue.

An audio signal processing method of the present invention includes at least a step of detecting an environmental ambient noise level contained in an audio signal inputted through sound collection means for collecting a transmission sound at the time of a voice call, a step of generating a control signal for changing an input/output characteristic of a signal level adjustment unit from the detected environmental ambient noise level, a step in which a received sound signal in the case of a telephone call voice is arranged to be an input signal and a signal level adjustment unit changes the input/output characteristic at the time of adjusting an output signal level with respect to an input signal level and adjusts a level of the received sound signal by means of the control signal, to thereby solve the above-described issue.

A communication terminal of the present invention includes a communication unit for performing communications for a voice call at least, a sound collection unit for collecting a transmission sound at the time of the voice call at least, a sound output unit for converting a received sound signal at the time of the voice call into a sound wave to be outputted, an environmental ambient noise level detection unit for detecting an environmental ambient noise level contained in an audio signal inputted through the sound collection unit, a signal level adjustment unit which has a level adjustment function to adjust an output signal level with respect to an input signal level and an input/output characteristic change function to change an input/output characteristic when adjusting a level in the level adjustment function by means of a control signal and in which a received sound signal in the case of the telephone call voice is arranged to be an input signal, and a control signal generation unit for generating the control signal for changing the input/output characteristic of the signal level adjustment unit from the environmental ambient noise level detected by the environmental ambient noise level detection unit, wherein the received sound signal outputted from the signal level adjustment unit is supplied to the sound output unit, to thereby solve the above-described issue.

That is, according to embodiments of the present invention, it is arranged that the level of the received sound signal in the case of the telephone call voice is adjusted based on the environmental ambient noise level, in other words, dynamics on the received sound side is controlled according to a magnitude of the environmental ambient noise level.

According to embodiments of the present invention, the level of the received sound signal in the case of the telephone call voice is adjusted based on the environmental ambient noise level, i.e., for example, the level adjustment is carried out to raise the level of the received sound signal when the environmental ambient noise is large, to thereby allow the ease of listening to the telephone call voice (in particular received voice) with less throughput.

DETAILED DESCRIPTION OF THE EMBODIMENTS

Hereafter, an embodiment of the present invention will be described with reference to the drawings.

It should be noted that in this embodiment, as an example of the present invention, a mobile phone terminal is mentioned, the contents described here are merely examples, and, not to mention that the present invention is not limited to this example.

[Schematic Structure of Mobile Phone Terminal]

Figure 1:
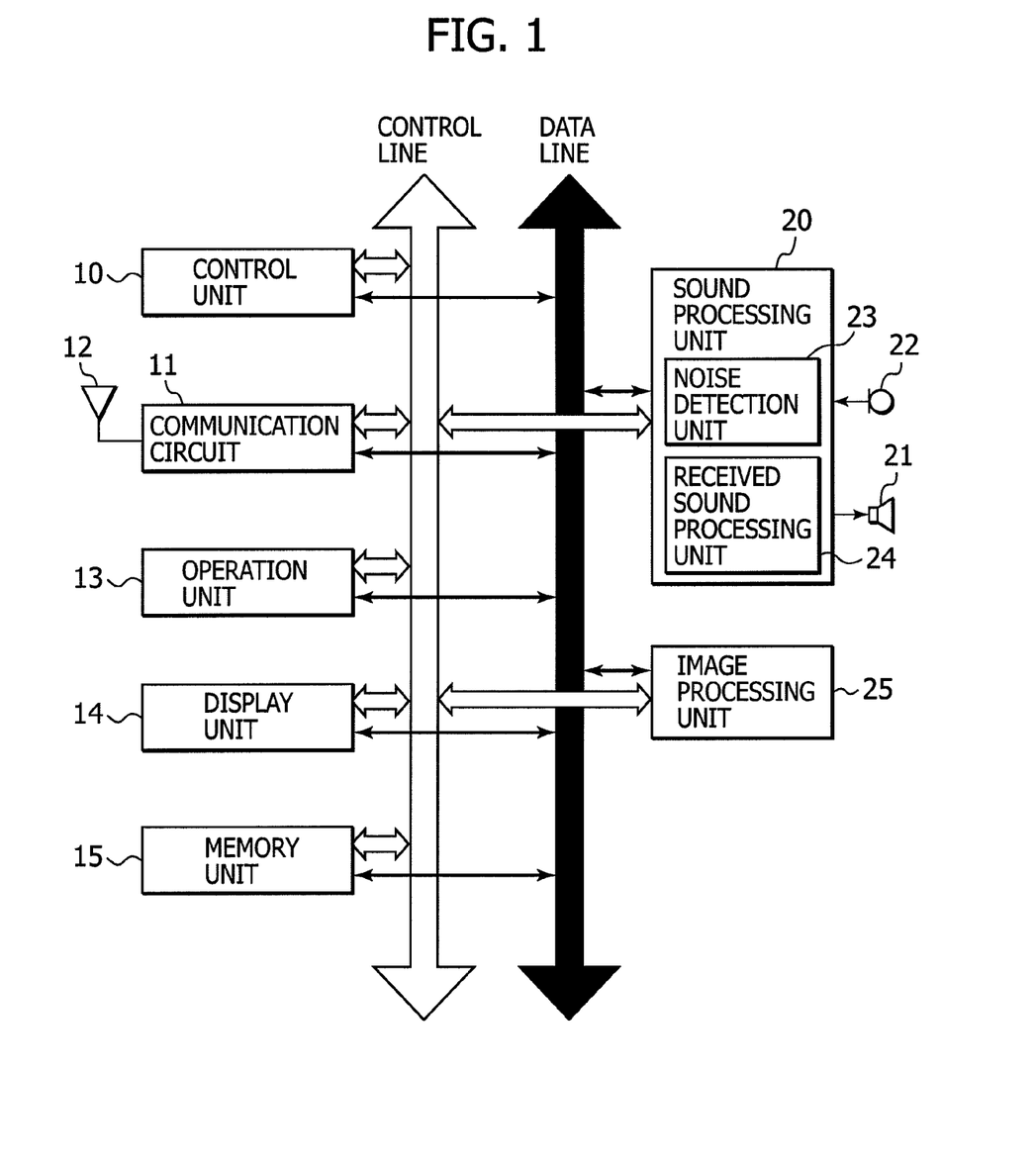
FIG. 1 is a block diagram showing a schematic structure of a mobile phone terminal of an embodiment in accordance with the present invention.

FIG. 1 shows a schematic structure of a mobile phone terminal of the present embodiment.

In FIG. 1, a communication antenna 12 is for example, a built-in antenna, and transmits and receives a signal wave for packet communications, such as an E-mail. A communication circuit 11 performs frequency conversion, modulation, demodulation, etc. for a transmission/reception signal.

A control unit 10 is constituted by a CPU (central processing unit), and performs control of communications in the communication circuit 11, control of sound processing, control of image processing, other various signal processing, control of each unit, etc. Further, the control unit 10 implements various types of control programs and an application program which are stored in a memory unit 15 and performs accompanying various data processings.

A speaker 21 is constituted by a speaker which is provided for the mobile phone terminal to receive a sound, or an output speaker for a ringer (ringer tone), an alarm sound, a beep sound, reproduction music, a digital sound, a sound of playback video, and converts the audio signal supplied from a sound processing unit 20 into a sound wave to be outputted in air.

A microphone 22 is a microphone for transmitting a sound and collecting external sounds, converts a sound wave into an audio signal, and inputs the audio signal into the sound processing unit 20.

After digital-to-analog conversion of sound data generated by predetermined sound processing, such as decoding, the sound processing unit 20 amplifies it, and outputs the amplified audio signal to the speaker 21. Further, the sound processing unit 20 subjects an input audio signal supplied from the microphone 22 to amplification and analog-to-digital conversion, and subjects the sound data after the analog-to-digital conversion to predetermined sound processing, such as coding. Furthermore, especially in the mobile phone terminal of the embodiment in accordance with the present invention, the sound processing unit 20 is provided with a noise detection unit 23 and a received sound processing unit 24. A detailed structure and detailed operation of the noise detection unit 23 and the received sound processing unit 24 will be described later.

An operation unit 13 is constituted by operation members, such as keys including numerical keys, a talk key, a hang-up/power key, and a cross key, and a jog dial etc. which are provided on a casing (not shown) of the mobile phone terminal of this preferred embodiment, and an operation signal generator which generates an operation signal when the operation member is operated.

A display unit 14 includes a display device, such as a liquid crystal display, an organic EL (Electro Luminescent) display, and a display drive circuit for the display, and displays various characters and messages, such as an E-mail, on the display, or displays a still image, moving image, etc. by means of an image signal supplied from the image processing unit 25.

An image processing unit 25 performs a process of generating image signals, such as a character, a sign, and an image displayed on the display unit 14. Further, the image processing unit 25 displays various types of user interface screens, a web page, etc. under control of the control unit 10.

The memory unit 15 includes ROM (Read Only Memory) and RAM (Random Access Memory). ROM includes a rewritable storage medium, such as a NAND type flash memory (NAND-type flash memory), and stores, for example, a program of OS (Operating System), a control program with which the control unit 10 controls each part, various types of application programs, music data contents and video data contents which are compressed and coded, as well as various types of initialized values, font data, each dictionary data, model name information, terminal identification information, etc. RAM stores data at any time as workspace when the control unit 10 performs various types of data processing.

In addition, although not shown in FIG. 1, the mobile phone terminal of this preferred embodiment is provided with various constituent elements provided for a common mobile phone terminal, such as for example, a digital camera unit for imaging a photograph picture, LED (light emitting diode) and its drive unit for lighting keys and for incoming call lights, etc., a battery which supplies electric power to each part and a power management IC unit which controls the electric power, a short-distance wireless communication unit for performing short-distance wireless communications by a so-called Bluetooth system (Bluetooth: registered trademark), a so-called UWB (Ultra Wide Band) system, wireless LAN (Local Area Network) etc., a non-contacting communication processing unit having a contactless IC card function and a reader/writer function, a GPS (Global Positioning System) communication unit, a slot for external memories, a receiving tuner unit for digital broadcast, an AV codec unit, a timer (clock unit), etc.

[Details of Noise Detection Unit and Received Voice Processing Unit and Description of Operation]

Figure 2:
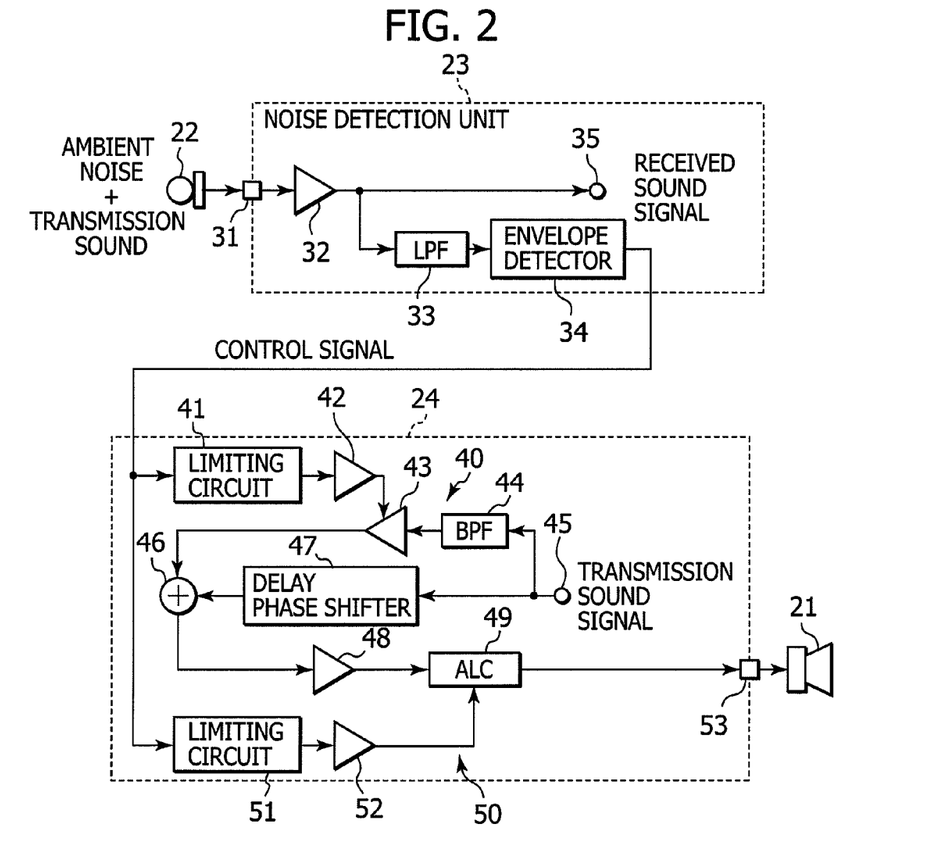
FIG. 2 is a block circuit diagram showing a detailed structure of a noise detection unit and a received sound processing unit which are provided in a sound processing unit of a mobile phone terminal of this present embodiment.

A detailed structure of the noise detection unit 23 provided in the sound processing unit 20 of the mobile phone terminal of this preferred embodiment and the received sound processing unit 24 is shown in FIG. 2. In addition, on account of the following description, an example is illustrated where an analog audio signal is processed, however, not to mention, it is possible to apply the present invention to the case where a digitized audio signal is processed.

The audio signal outputted from the microphone 22 used for a telephone call is inputted into a microphone sound input terminal 31 of the noise detection unit 23 provided in the sound processing unit 20. The audio signal inputted in to the microphone sound input terminal 31 is amplified with amplifier 32, and then outputted as a transmission sound signal from a transmission sound output terminal 35 to a circuit unit (not shown) for usual transmission sound processing.

Further, in this preferred embodiment, the audio signal after being amplified with the amplifier 32 branches from an output path of the transmission sound, and it is passed to a low pass filter (LPF) 33. The branch path to a low pass filter 33 is provided in order to check to what degree the environmental ambient noise is included in the audio signal inputted from the microphone 22.

Figure 3:
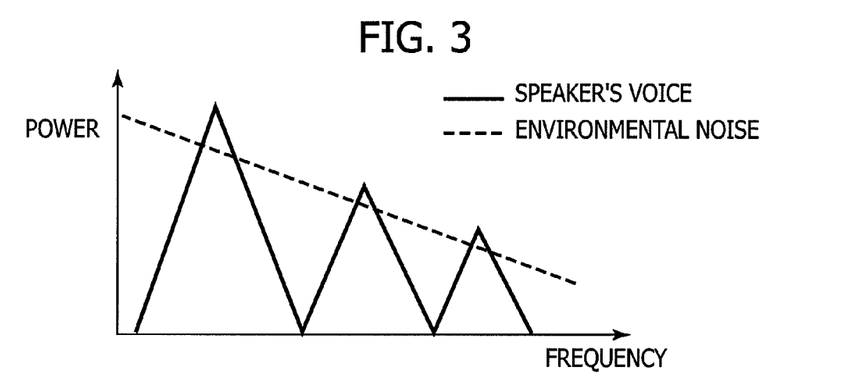
FIG. 3 is a schematic diagram used for explanation of a human voice frequency characteristic.

Here, a specific peak (formant) exists in a frequency characteristic of human's voice as can be seen from a characteristic curve shown by a solid line in FIG. 3. Although there are individual frequency differences in the formant, there are two distinctive peaks (formant) between 300 Hz and 3.4 kHz in general. The first formant is at around 500 kHz-1 kHz and the second formant is at around 1.5 kHz-3 kHz.

On the other hand, the environmental ambient noises may depend on the environments and various types may be considered, however, it is often the case that a frequency characteristic of the environmental ambient noise in an environment where a common mobile phone terminal is used may be attenuated from a low frequency band towards a high frequency band like a characteristic curve shown by a dotted line in FIG. 3.

Figure 4:
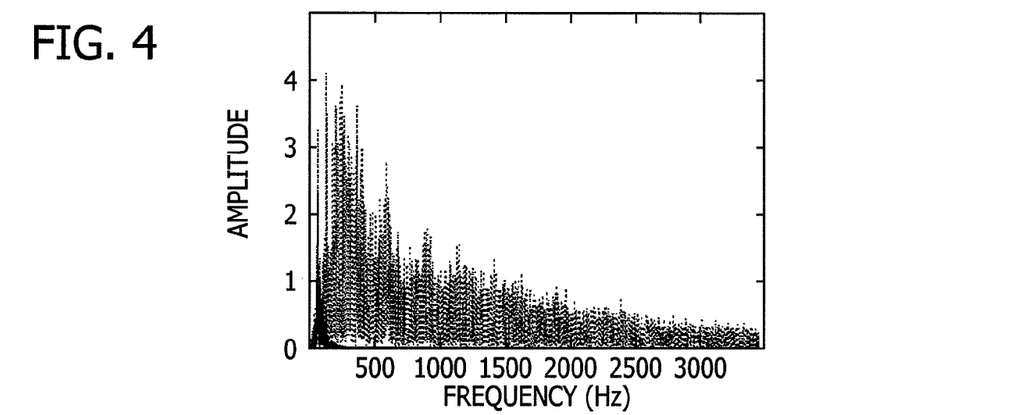
FIG. 4 is a graph of an amplitude-frequency characteristic of a received sound signal by actually measuring environmental ambient noises.
Figure 5:
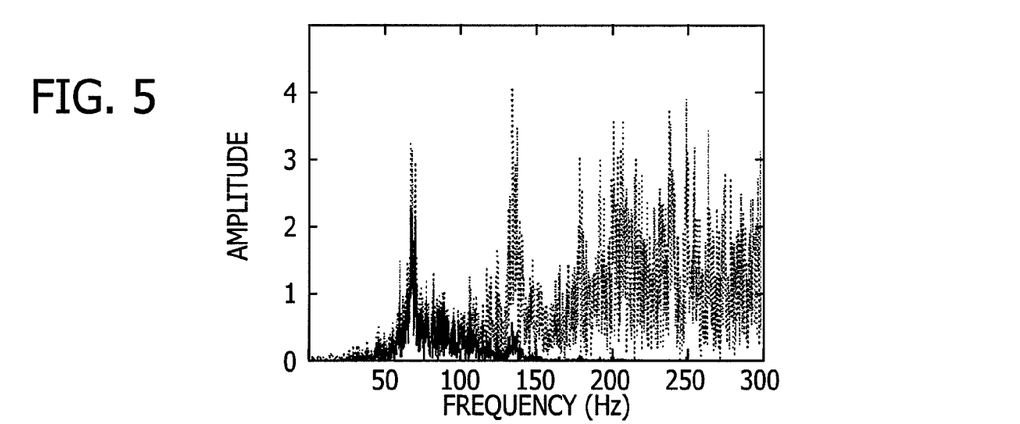
FIG. 5 shows a graph of the amplitude-frequency characteristic in which components between 0 Hz and 300 Hz of the received sound signal in FIG. 4 are enlarged.
Figure 6:
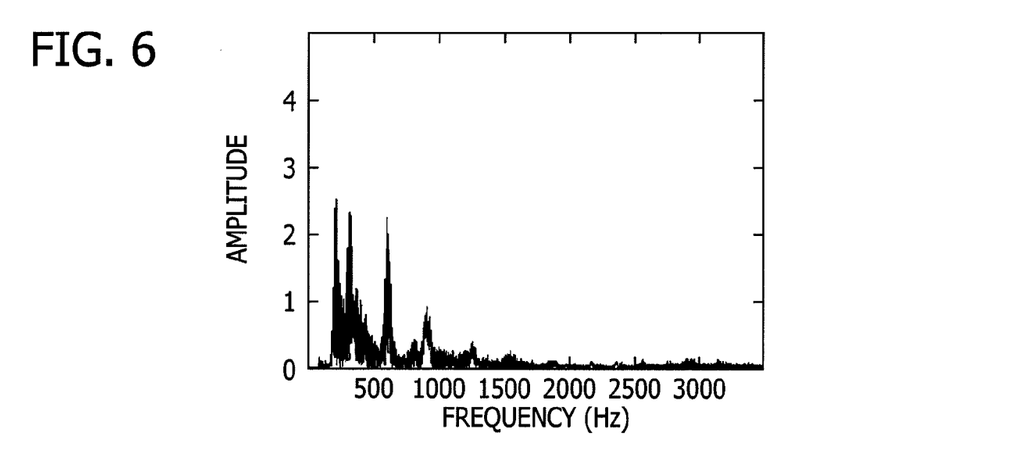
FIG. 6 shows a graph of an amplitude-frequency characteristic of a formant of the received sound signal which is actually measured.
Figure 7:
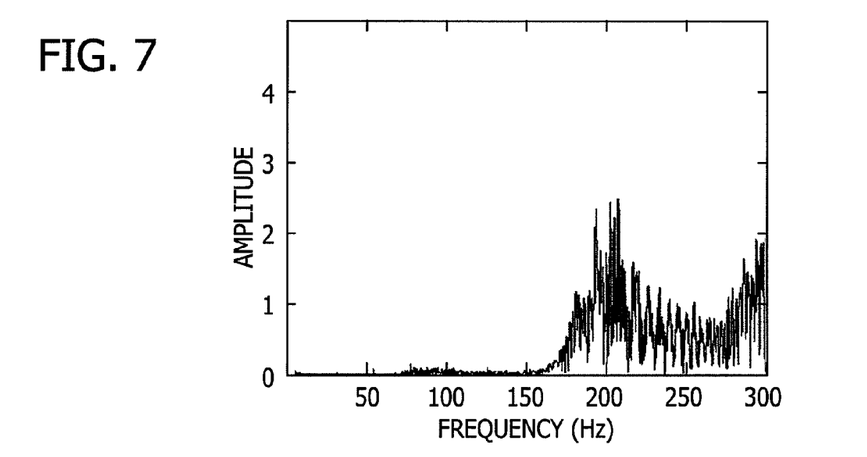
FIG. 7 shows a graph of the amplitude-frequency characteristic in which components between 0 Hz and 300 Hz of the received sound signal in FIG. 6 are expanded.

Further, FIG. 4 shows a graph of an amplitude-frequency characteristic of the received sound signal which is actually measured and includes environmental ambient noises, and FIG. 5 shows a graph in which components between 0 Hz and 300 Hz of the received sound signal of FIG. 4 are expanded. Furthermore, FIG. 6 shows a graph of an amplitude-frequency characteristic of the formant of the received sound signal which is actually measured and FIG. 7 shows a graph in which components between 0 Hz and 300 Hz of the received sound signal of FIG. 6 are expanded.

Figure 8:
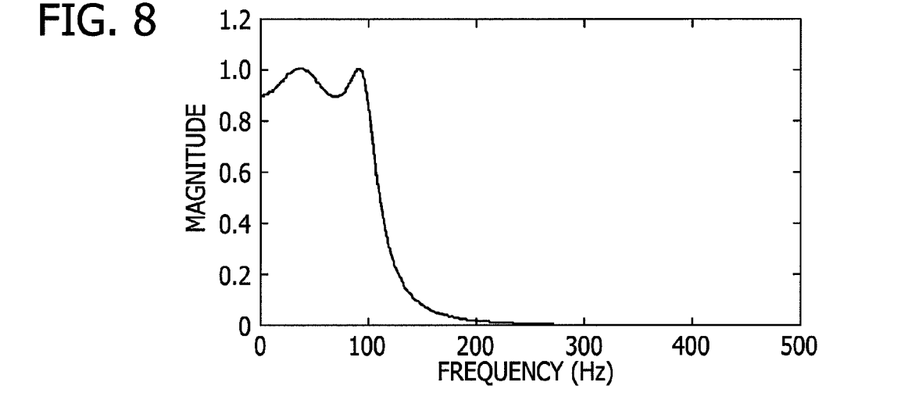
FIG. 8 is a graph showing a frequency characteristic of a low pass filter of the noise detection unit.

Thus, in this preferred embodiment, in order to specify to what degree of the environmental ambient noise is included in the audio signal inputted through the microphone 22, it is passed through the low pass filter 33 having a comparatively steep characteristic (as shown, for example, in FIG. 8) where a frequency band lower than the first formant in the frequency characteristic of the above-described human's voice is a cut-off frequency. It should be noted that, in this preferred embodiment, it is assumed that a filter having approximately the fourth Chebyshev characteristic at a cutoff frequency of 50 Hz-140 Hz (especially around 100 Hz in example of FIG. 8) is used as the low pass filter 33.

Figure 9:
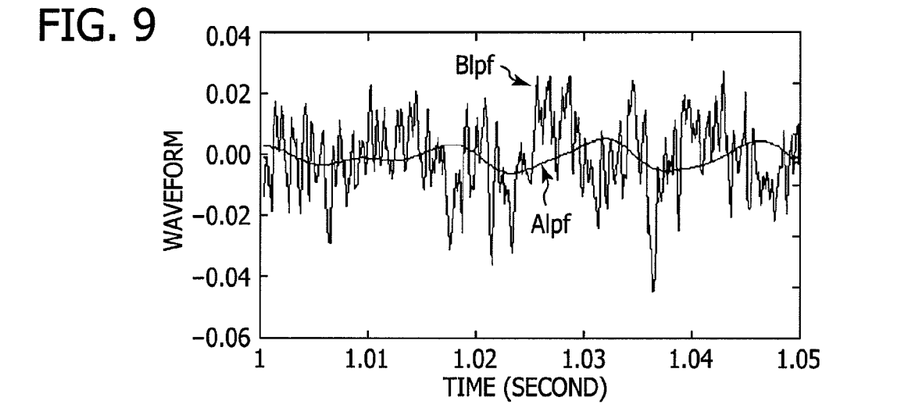
FIG. 9 is a waveform chart showing an LPF passed signal waveform after passing the audio signal waveform which is inputted from a microphone through the low pass filter of the noise detection unit.

According to this preferred embodiment, since the low pass filtering is carried out by means of such a low pass filter 33, an audio signal waveform Blpf inputted through the microphone 22 is like a signal waveform Alpf after passing through LPF, as shown in FIG. 9. In other words, the signal waveform Alpf after passing through LPF is a signal waveform which is obtained by extracting only a frequency band component with very few human's voice components (that is, signal components of environmental ambient noise) from the output signal through the microphone 22.

The signal passed through the low pass filter 33 (that is, signal component of environmental ambient noise) is sent to an envelope detector 34, as shown in FIG. 2.

Figure 10:
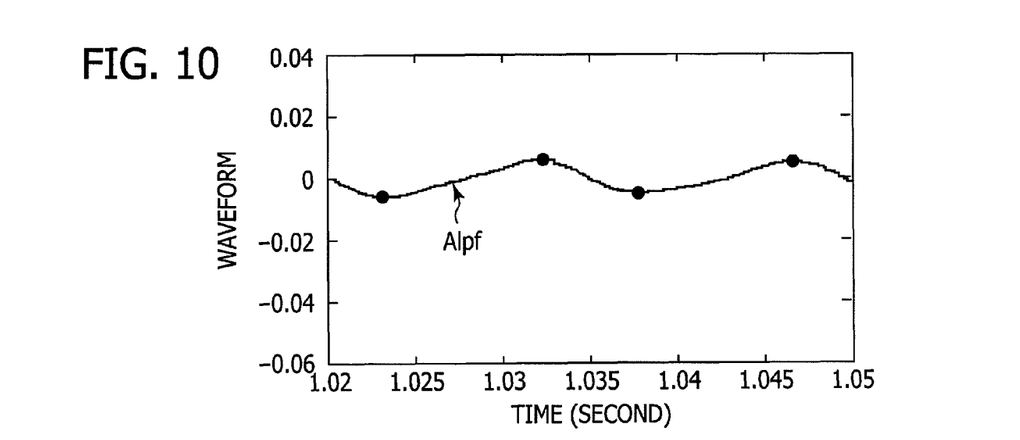
FIG. 10 is a waveform chart used for explanation of envelope detection in an envelope detection unit of the noise detection unit.
Figure 11:
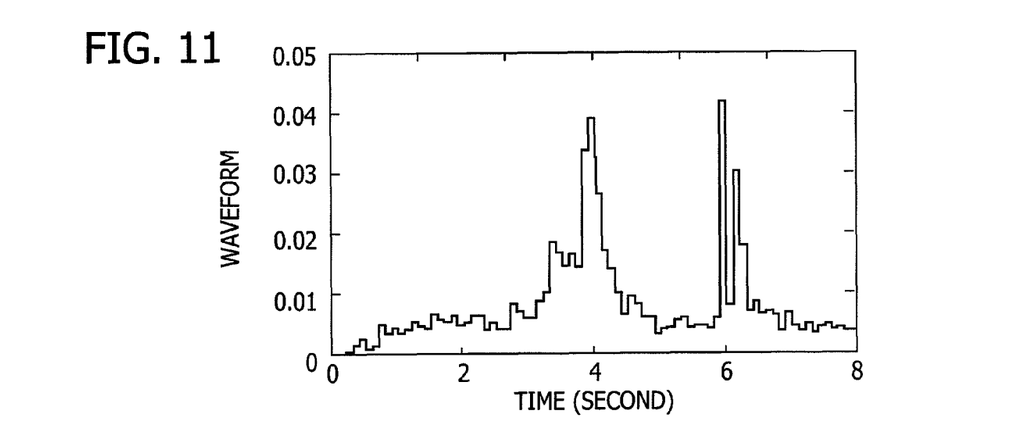
FIG. 11 is a waveform chart of a control signal (signal showing rough energy transition of environmental ambient noise) outputted from the envelope detection unit of the noise detection unit.

The envelope detector 34 subjects the signal, as shown in FIG. 10, after passing through the low pass filter 33 to envelope detection, in particular equalizes and samples the signal waveform Alpf, after passing through LPF, at regular intervals of time to generate a signal as shown in FIG. 11 which illustrates rough energy transition of the environmental ambient noise. In addition, in the envelope detector 34, what intervals (cycles equalized at regular intervals of time) the energy transition is detected at is not limited here in particular. It is, however, desirable that they may be intervals of time according to processing time units (for example, 100 msec) used in the latter received sound processing unit 24. The output signal of the envelope detector 34 is arranged to be a control signal for a dynamics adjustment unit 50 of the received sound processing unit 24 and a formant adjustment unit 40 to be described later.

The received sound processing unit 24 is provided with and constituted by the dynamics adjustment unit 50 for performing a process of controlling the input/output characteristic (dynamics) of the received sound signal sent from a talk partner if needed, and the formant adjustment unit 40 (equalizer which emphasizes outline components of voice of received sound) for performing a process of emphasizing the second formant, in particular, which is one of the formants contained in the received sound signal and whose frequency band does not easily overlap with the peak of the environmental ambient noise.

[Structure of Dynamics Adjustment Unit and Description of Operation]

First, the dynamics adjustment unit 50 of the received sound processing unit 24 will be described, and then the formant adjustment unit 40 will be described.

In the received sound processing unit 24, the received sound signal sent from the circuit unit (not shown) for the usual received sound processing is inputted into the received sound input terminal 45.

This received sound signal is sent to a band pass filter (BPF) 44 to be mentioned later of the formant adjustment unit 40 and also sent to a delay phase shifter unit 47.

The received sound signal through the delay phase shifter unit 47 to be mentioned later and through an adder 46 to be mentioned later is amplified, if needed, with an amplifier 48 of the dynamics adjustment unit 50, and then inputted into an auto level controller (ALC) 49.

Figure 12:
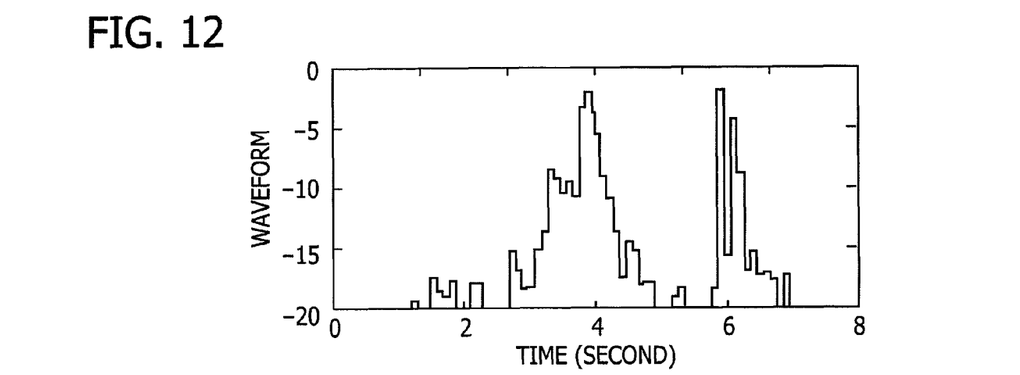
FIG. 12 is a signal waveform chart obtained after the control signal which is outputted from the envelope detector of the noise detection unit passes the limiter and an amplifier of a dynamics adjustment unit.

Further, as for a control signal as shown in FIG. 11 and outputted from the envelope detector 34 of the noise detection unit 23, a portion which exceeds a predetermined level is limited in level by a limiter 51 of the dynamics adjustment unit 50, and further adjusted in level, if needed, with an amplifier 52, so that it is arranged to be a signal as shown in FIG. 12, for example, and then it is supplied to the auto level controller 49.

Then, the output signal of the auto level controller 49 is outputted to the speaker 21 for receiving sounds through a received sound output terminal 53. In addition, a detailed structure of the auto level controller 49 of this preferred embodiment will be described later.

Figure 13:
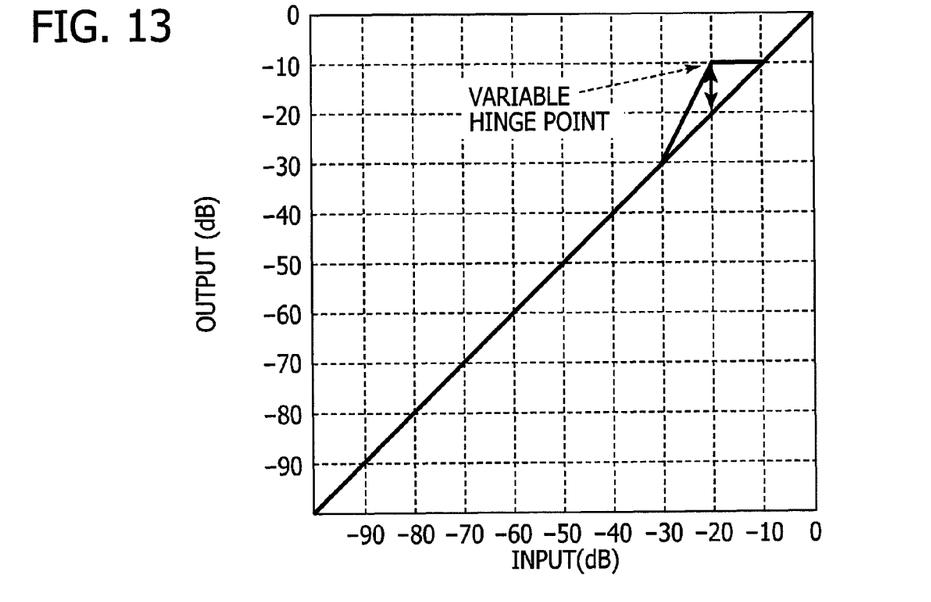
FIG. 13 is a characteristic graph showing an input/output characteristic curve of an auto level controller having a variable hinge point in accordance with the present embodiment.
Figure 14:
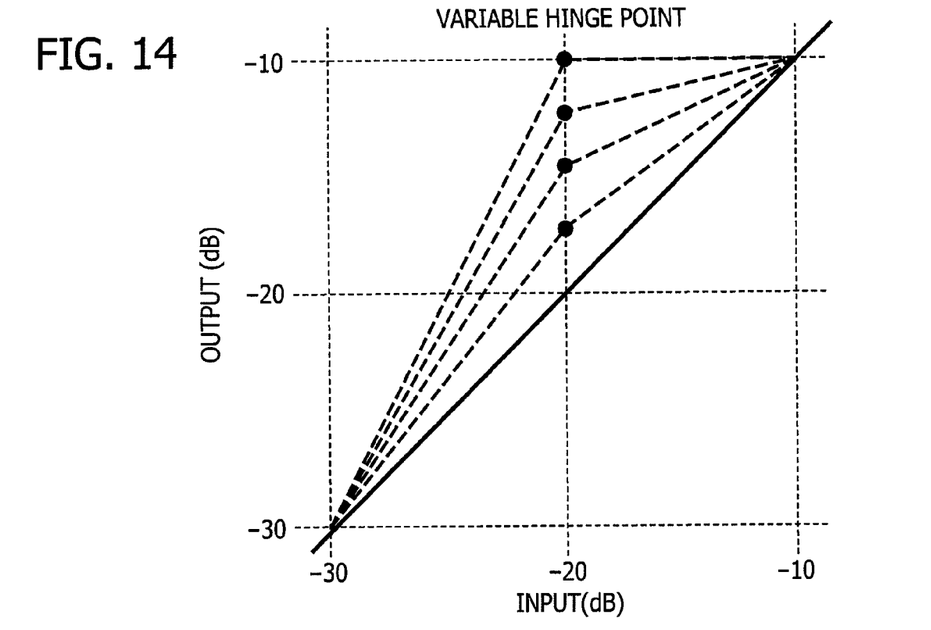
FIG. 14 is an enlarged characteristic graph of the variable hinge point in the periphery of FIG. 13.
Figure 15:
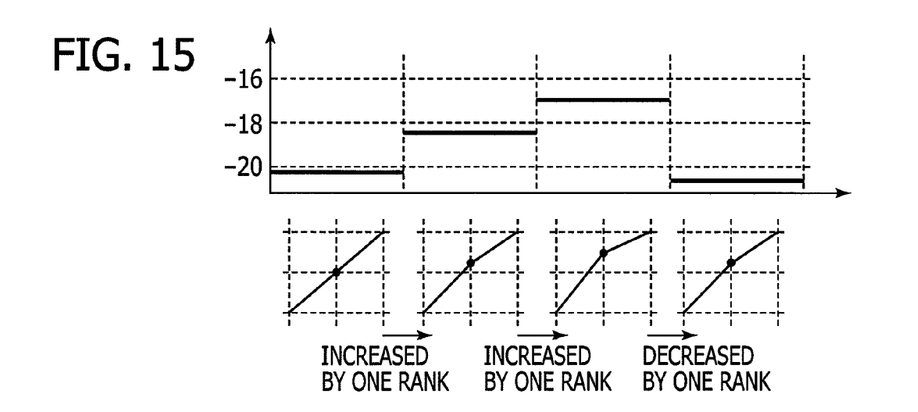
FIG. 15 is a chart used for explanation of a change relationship between a level change of the control signal and the variable hinge point.

Here, a common auto level controller (ALC) is to have one input/output characteristic curve, and an input level and an output level are to have a characteristic with one-to-one correspondence. On the other hand, the auto level controller 49 provided for the received sound processing unit 24 of this preferred embodiment is arranged such that the input/output characteristic itself may be changed by the control signal as shown in FIG. 12. In particular, the auto level controller 49 of this preferred embodiment is arranged to have the input/output characteristic with a variable hinge point as shown in FIGS. 13-15. In addition, FIG. 14 is an enlarged graph at the variable hinge point of FIG. 13, and FIG. 15 is a chart showing a relationship between a level change of a control signal and a change of the variable hinge point.

In other words, the auto level controller 49 of this preferred embodiment carries out level control as follows:

As shown in FIGS. 13 and 14, for example, within a predetermined input level range (in FIGS. 13 and 14, for example, within range between −30 dB (inclusive) and −10 dB as upper limit) which is assumed to be a human voice signal level of the received sound, a value of the output level with respect to the input level can be varied over a plurality of steps for every 1 dB to a maximum of 10 db, for example (11 steps for every 1 dB step as an example).

As shown in FIG. 15, if a value of the following control signal becomes large with respect to the value of the previous control signal, the variable hinge point is moved only by one step in a direction in which the output level increases (increase by one rank). Conversely, if the value of the following control signal becomes small with respect to the value of the previous control signal, the variable hinge point is moved in a direction in which the output level becomes low (decrease by one rank).

In more particular description, the auto level controller 49 of this preferred embodiment performs dynamics control such that when the input level is within the predetermined input level range, in the case where the value of the control signal is large, for example, (that is, in the case where environmental ambient noise is loud), the variable hinge point is changed in a direction in which the output level is raised with respect to the input level to strengthen the effect of the auto level controller. On the other hand, for example, in the case where the value of the control signal is small, (that is, in the case where environmental ambient noise is small), it performs the dynamics control such that the variable hinge point is changed to approach a one-to-one relationship between the output level and the input level, thus reducing the effect of the auto level controller.

Figure 16:
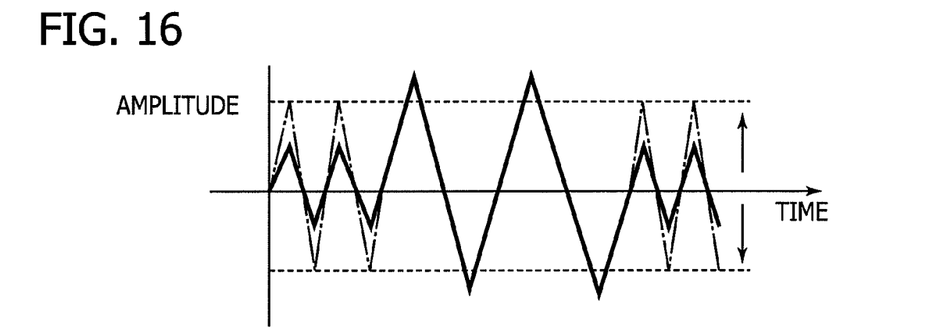
FIG. 16 is a waveform chart showing a rough amplitude waveform of the received sound signal after being subjected to level adjustment by the auto level controller in accordance with the present embodiment.

In other words, in the case where the received sound signal which is higher than or equal to a certain level is inputted and when the environmental ambient noise is loud (when the value of the control signal is large), the auto level controller 49 of this preferred embodiment adjusts the input/output characteristic of the auto level controller in a direction in which input level output level=1:n ("n" in this case is greater than 1 and of value corresponding to each variable hinge point for every 1 dB step), to thereby raise the output level of the received sound signal and allow the ease of listening to the received sound, as shown in FIG. 16, for example. On the other hand, when the environmental ambient noise is small (when value of control signal is small), the input/output characteristic of the auto level controller is adjusted to approach "input level:output level=1:1", so that sound quality degradation of the received sound due to the dynamics control by the auto level controller may be reduced to the minimum. It should be noted that a solid line in FIG. 16 represents an amplitude waveform of an actual received sound signal, and chain dotted lines in FIG. 16 represent an amplitude waveform of the received sound signal when the output level is raised according to this preferred embodiment.

As described above, according to this preferred embodiment, for example, in the case where the environmental ambient noise becomes large and the input/output characteristic of the auto level controller 49 is adjusted in the direction in which "input level:output level=1:n", even if some sound quality degradation arises in the received sound, the level of the received sound becomes relatively high with respect to the environmental ambient noise, thus the received sound becomes easy to hear. On the other hand, in the case where the environmental ambient noise becomes small and the input/output characteristic of the auto level controller 49 is adjusted in the direction to approach "input level:output level=1:1", then the level of the received sound does not become high, but a possibility that the environmental ambient noise may have a bad influence on a telephone call becomes low, because the original level of environmental ambient noise is also small. Further, the sound quality degradation of the received sound also decreases, and the received sound becomes easy to hear.

Further, in the above description, as shown in FIGS. 13 and 14, the variable hinge point is mentioned as an example in which the value of the output level with respect to the input level may be changed over the plurality of steps for every 1 dB to the maximum of 10 dB (for example). However, the variable hinge point may change not only discontinuously but also continuously, for example.

Further, in the above example, for the sake of brevity in description, an example of the dynamics control by means of the variable hinge point in the auto level controller 49 is one in which the control is carried out to directly follow changes in loudness of the environmental ambient noise. However, for example, in the case where the environmental ambient noise changes rapidly, it is possible that the received sound after the dynamics control changes so rapidly that sense of incongruity is felt on user's hearing. For this reason, the dynamics control by the auto level controller 49 of this preferred embodiment is arranged such that some degree of hysteresis may be provided with respect to the change of the variable hinge point in order to prevent such a rapid change, as described above, for example.

Further, in FIGS. 13 and 14, as an example of a characteristic curve of a portion where the input/output characteristic of the auto level controller 49 is changed, there may be mentioned a characteristic curve (characteristic curve of variable hinge point) which bends at a portion of a predetermined input level (input level of −20 dB in example of FIG. 13 and FIG. 14). However, for example, as shown in FIG. 17, in a situation where a line segment having a certain length is provided that is parallel to the input/output characteristic curve in which the input level and the output level are of a one-to-one relationship, it is also possible to use a characteristic curve which is changed with a plurality of steps (discontinuously) or continuously.

In other words, in the case of the example of FIG. 17, the auto level controller 49 carries out the dynamics control as follows:

Within a predetermined input level range which is assumed to be the human voice signal level of the received sound, the value of the output level with respect to the input level can be varied over the plurality of steps for every 1 dB to the maximum of 10 dB, for example (11 steps for every 1 dB step as an example). When the value of the following control signal becomes large with respect to the value of the previous control signal, a gain is moved only by one step in the direction in which the output level becomes high. Conversely, when the value of the following control signal becomes small with respect to the value of the previous control signal, the gain is moved in the direction in which the output level becomes low.

Figure 17:
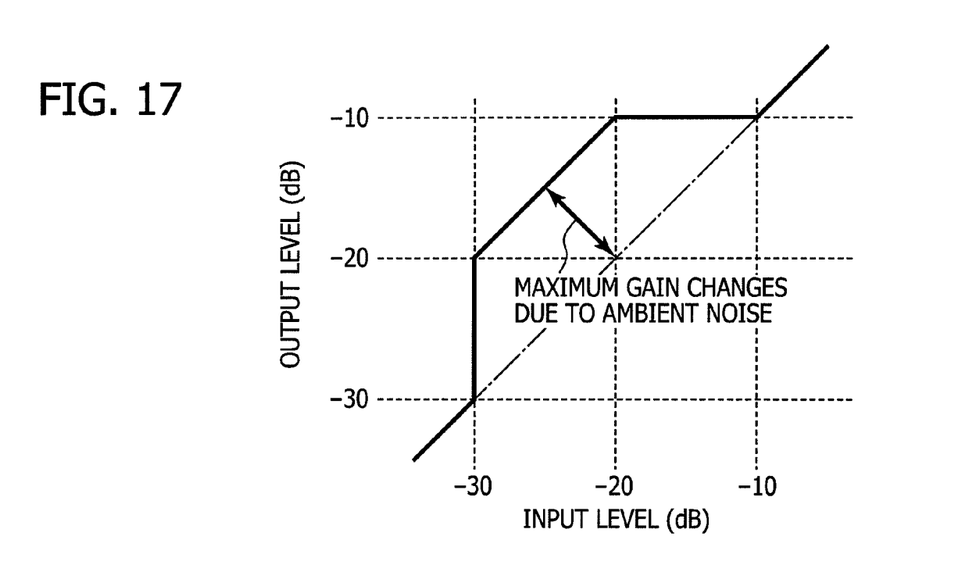
FIG. 17 is a characteristic graph used for explanation of an example in which the input/output characteristic of the auto level controller is changed in a situation where a line segment parallel to the input/output characteristic curve is provided in which an input level and an output level are of one-to-one correspondence.

In the case of the example of FIG. 17, since the input/output characteristic curve originally provided for the auto level controller 49 is only moved in parallel, there is little change in the circuit structure and it can be realized easily at low cost.

In addition, in the case of the dynamics control, the input/output level is detected and it is desirable that, for example, attack time for adjusting the gain (time when lowering gain) and recovery time (time when raising gain) are provided, and the attack time and recovery time are adjusted according to the detected value of the input/output level, to thereby prevent the gain from changing rapidly.

Figure 18:
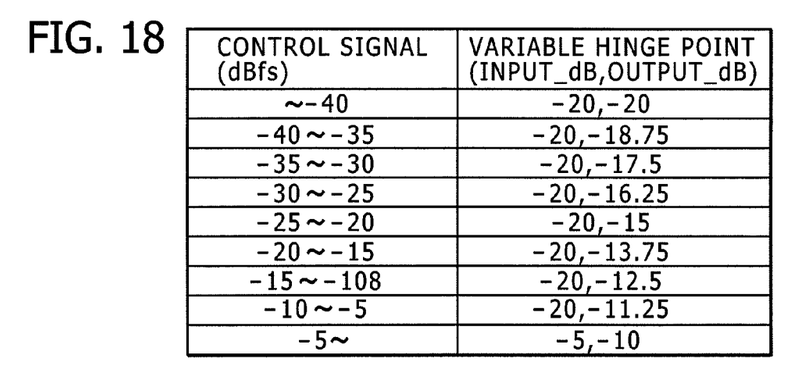
FIG. 18 is a table showing an example of a relationship between the control signal and the variable hinge point in the case of controlling the input/output characteristic of the auto level controller by digital processing.
Figure 19:
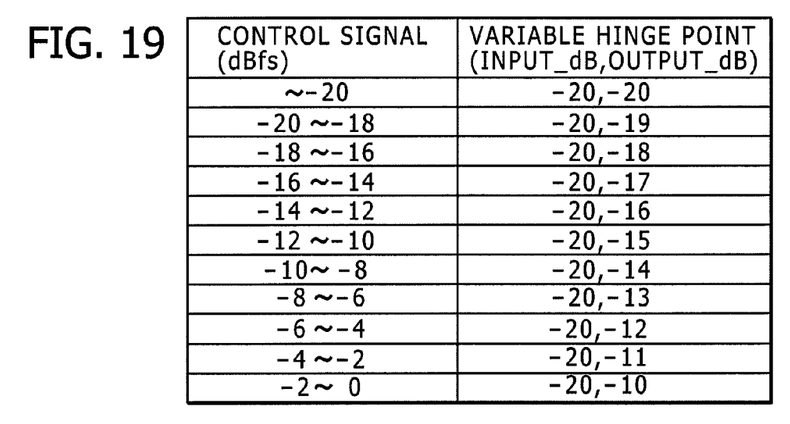
FIG. 19 is a table showing another example of a relationship between the control signal and the variable hinge point in the case of controlling the input/output characteristic of the auto level controller by digital processing.

Further, although analog processing is described by way of example in the above description, it is also possible that when using digital processing (for example), a relationship as shown in FIG. 18 or FIG. 19 may be provided between the control signal and the variable hinge point. Each time the control signal is inputted at regular intervals of time (for example, 100 msec intervals), a value of the control signal corresponding to the variable hinge point at the time is compared with a value of the inputted control signal. When the value of the inputted control signal is larger, the variable hinge point may be shifted only by one step in the direction in which the output becomes large. Conversely, when the value of the inputted control signal is smaller, the variable hinge point may be shifted in the direction in which the output becomes small. In this way, even if this is the case where digital processing is used, the rapid change of the variable hinge point can be prevented.

According to this preferred embodiment, by performing the above processes, it is possible to improve the ease of listening to the telephone call voice under the environmental ambient noise without increasing the amount of processing.

[Structure of Formant Adjustment Unit and Description of Operation]

Next, the formant adjustment unit 40 of the received sound processing unit 24 will be described.

Figure 20:
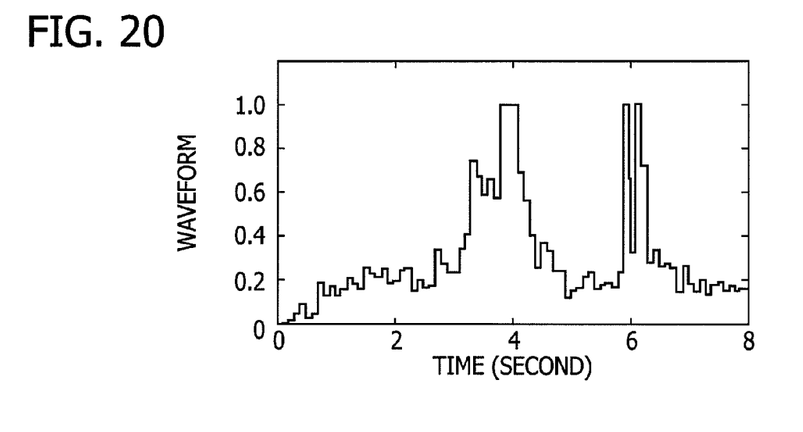
FIG. 20 is a waveform chart showing the signal waveform after the control signal of FIG. 11 outputted from the envelope detector of the received sound processing unit passes through the limiter and the amplifier of a formant adjustment unit.

As for the control signal as shown in FIG. 11 which is outputted from the envelope detector 34 of the received sound processing unit 24, a portion which exceeds a specified level is limited in level by a limiting circuit 41 of a formant adjustment unit 40, and further adjusted in level, if needed, with an amplifier 42, so that it is arranged to be a signal as shown in FIG. 20 and then it is sent to an amplifier 43 as the control signal.

Figure 21:
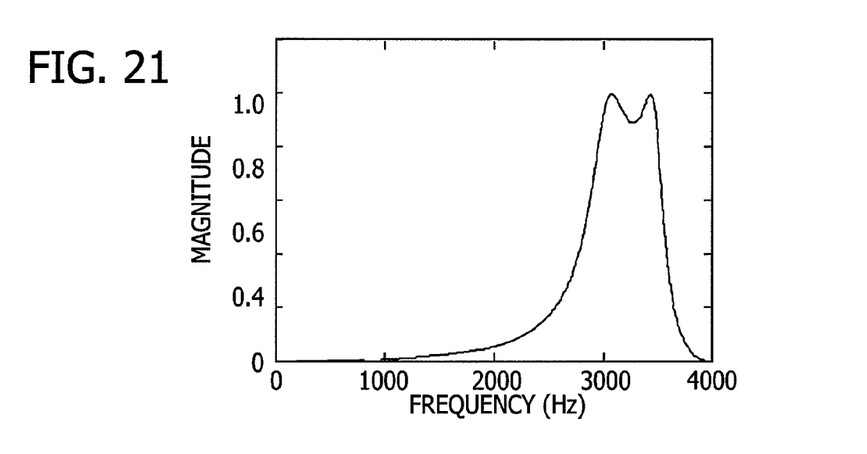
FIG. 21 is a characteristic graph showing a frequency characteristic of a band pass filter of the formant adjustment unit.
Figure 22:
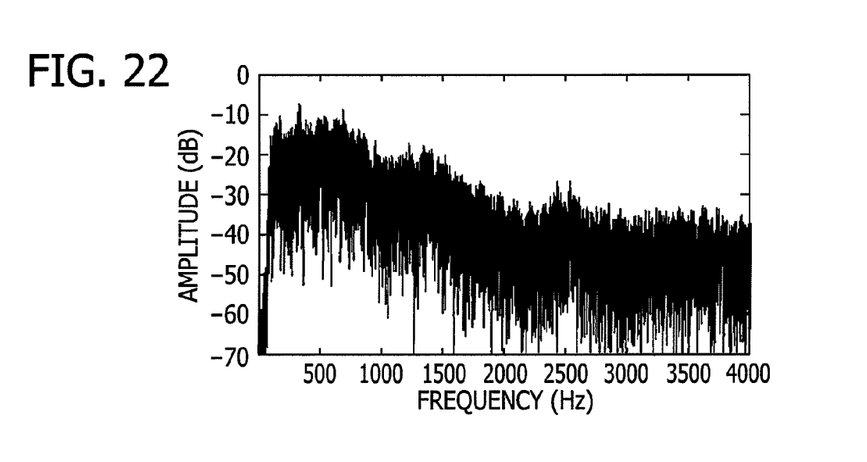
FIG. 22 is a graph showing amplitude-frequency measurement by actually measuring the received sound signal inputted through the received sound signal input terminal.
Figure 23:
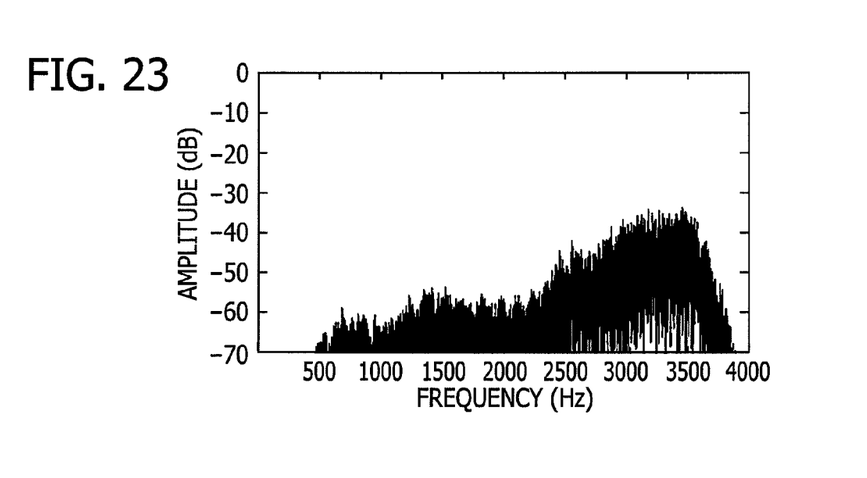
FIG. 23 is a graph showing amplitude-frequency measurement by actually measuring the received sound signal after being subjected to band pass processing by means of the band pass filter of the formant adjustment unit.

Further, a band pass filter 44 to which the received voice signal from the received voice input terminal 45 is inputted is a filter provided with a frequency characteristic as shown in FIG. 21. That is, the band pass filter 44 is especially arranged to be a filter which passes only a frequency band of the second formant whose frequency band does not easily overlap with the peak of environmental ambient noise among the frequency bands of the received sound signal. In addition, FIG. 22 is a graph showing amplitude-frequency measurement by actually measuring the received sound signal inputted through the received sound signal input terminal 45, and FIG. 23 is a graph showing amplitude-frequency measurement by actually measuring the received sound signal after band pass processing by means of the band pass filter 44.

The received sound signal, passed through the band pass filter 44, of the frequency band of the second formant is inputted to the amplifier 43.

Figure 24:
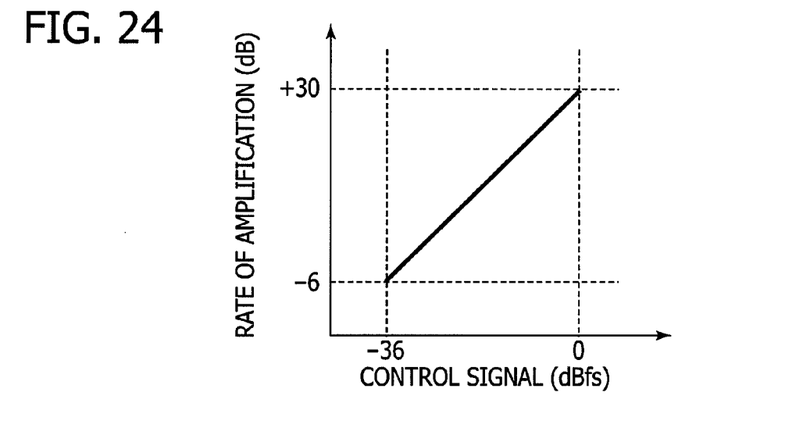
FIG. 24 is a characteristic graph showing a relationship between the control signal and the rate of amplification in the amplifier of the formant adjustment unit.
Figure 25:
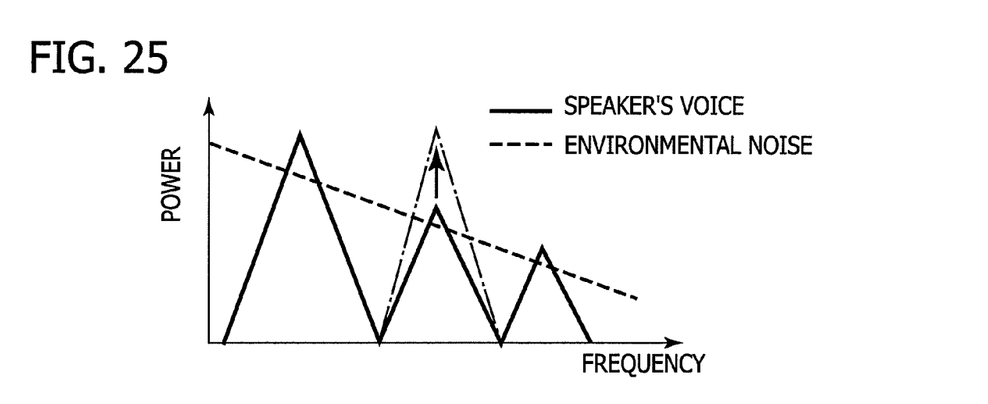
FIG. 25 is a schematic graph used for explaining a situation where the frequency characteristic of the second formant in the frequency characteristic of human's voice is adjusted by the formant adjustment unit.
Figure 26:
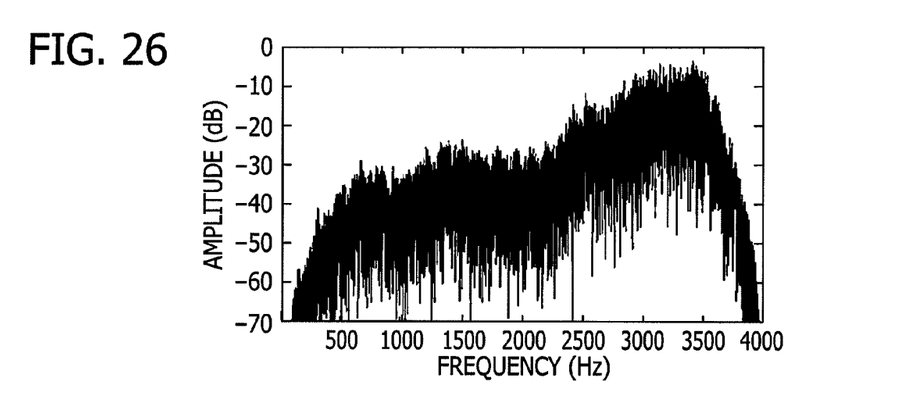
FIG. 26 is a graph showing amplitude-frequency measurement by actually measuring the received sound signal after adjusting a gain by the amplifier of the formant adjustment unit.

Here, the amplifier 43 is arranged to be an amplifier which has a relationship between a rate of amplification as shown in FIG. 24 and the control signal, whereby like the characteristic curve as shown by a chain dotted line in FIG. 25 as similarly shown in FIG. 3, in the amplifier 43, the signal of the frequency band of the second formant among the received sound signals is subjected to gain adjustment processing (emphasis processing) according to the relationship between the control signal of FIG. 24 and the rate of amplification. In addition, FIG. 26 is a graph showing amplitude-frequency measurement by actually measuring the received sound signal after the gain adjustment by means of the amplifier 43.

Then, the output signal of the amplifier 43 is sent to the adder 46.

Further, the adder 46 is supplied with the received sound signal after delay and phase adjustment by means of a delay phase shifter 47. In addition, the delay phase shifter 47 is provided for giving delay similar to the delay by means of the band pass filter 44 of the formant adjustment unit 40 to the received sound signal inputted into the received sound input terminal 45.

Figure 27:
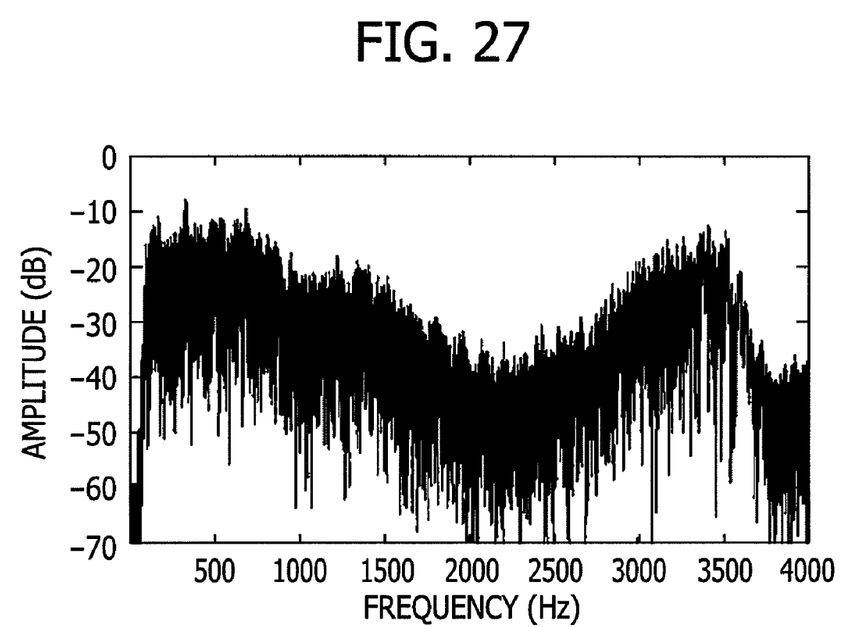
FIG. 27 is a graph showing amplitude-frequency measurement by actually measuring the received sound signal after addition processing with an adder of the formant adjustment unit.

In the adder 46, the output signal (that is, signal subjected to gain adjustment of second formant) of the amplifier 43 is added to the received sound signal after time and phase adjustment by means of the delay phase shifter unit 47. In other words, as shown in FIG. 25, the output signal of the adder 46 turns into a signal subjected to a process of emphasizing the second formant (among the formants contained in the received sound signal) whose frequency band does not easily overlap especially with the peak of the environmental ambient noise. In addition, FIG. 27 is a graph showing amplitude-frequency measurement by actually measuring the received sound signal after the addition processing by means of the adder 46.

Then, the signal outputted from the adder 46 is sent to the amplifier 48 of the dynamics adjustment unit 50 as described above.

CONCLUSION

As described above, according to this preferred embodiment, the process of controlling the input/output characteristic (dynamics) of the received sound signal sent from the talk partner is performed according to the degree of the environmental ambient noise, to thereby allow the ease of listening to the received sound. Further, the process of controlling the dynamics of the received sound signal according to the degree of the environmental ambient noise can be realized with very small amount of throughput by the low pass filter, the envelope detection, and the auto level control only.

Furthermore, according to this preferred embodiment, at the same time as the dynamics control is performed for the received sound signal, the second formant (among the formants contained in the received sound signal) whose frequency band does not easily overlap especially with the peak of the environmental ambient noise is emphasized (outline components of voice of received sound are raised), to thereby allow the ease of listening to the received sound.

It should be noted that, the above description of the preferred embodiments is merely an example of the present invention. Thus, the present invention is not limited to each of the above-described preferred embodiments, and can naturally be modified variously according to design etc. as long as the invention does not depart from technical ideas of the present invention.

For example, in the above-described preferred embodiments, the mobile terminals, such as a mobile phone terminal, are mentioned by way of example. However, the present invention can be applied also to fixed communication terminals, such as a fixed-line telephone. In addition, the present invention can also be applied to various types of mobile terminals, such as PDA (Personal Digital Assistants) provided with a voice call function, for example.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-293962 filed in the Japanese Patent Office on Nov. 13, 2007, the entire content of which being incorporated herein by reference.

What is claimed is:

1. An audio signal processing apparatus, comprising at least:
   an environmental ambient noise level detection unit for detecting an environmental ambient noise level contained in an audio signal input through sound collection means for collecting a transmission sound at a time of a voice call;
   a signal level adjustment unit which has (a) a level adjustment function to adjust a predetermined formant component for an output signal level with respect to an input signal level, and (b) an input/output characteristic change function to change an input/output characteristic when adjusting a level in the level adjustment function by means of a control signal, and in which a received sound signal in the case of a telephone voice call is arranged to be an input signal, wherein the predetermined formant component has a frequency band which does not overlap with a peak of environmental ambient noise; and
   a control signal generation unit for generating the control signal for changing the input/output characteristic of the signal level adjustment unit from the environmental ambient noise level detected by the environmental ambient noise level detection unit.

2. The audio signal processing apparatus according to claim 1, wherein, from the environmental ambient noise level, the control signal generation unit generates the control signal for changing the input/output characteristic of the signal level adjustment unit in a direction in which the output signal level increases with respect to the input signal level when a value of the environmental ambient noise level is higher than a specified value.

3. The audio signal processing apparatus according to claim 2, wherein when a value of the environmental ambient noise level changes in a direction to decrease, the control signal generation unit generates, from the environmental ambient noise level, the control signal for changing the input/output characteristic of the signal level adjustment unit in a direction in which a relationship between the input signal level and the output signal level approaches one-to-one.

4. The audio signal processing apparatus according to claim 1, wherein the signal level adjustment unit changes the input/output characteristic gradually or continuously by means of the control signal.

5. The audio signal processing apparatus according to claim 1, wherein the environmental ambient noise level detection unit has a low pass filter which carries out low pass filtering of the audio signal input through the sound collection means with a predetermined cutoff frequency, and
   the control signal generation unit carries out envelope detection of the signal subjected to the low pass filtering by the low pass filter of the environmental ambient noise level detection unit, and generates the signal after the envelope detection as the control signal.

6. The audio signal processing apparatus according to claim 1, wherein the signal level adjustment unit provides hysteresis for change of the input/output characteristic by a control signal.

7. The audio signal processing apparatus according to claim 1, comprising:
   a formant adjustment unit which emphasizes the predetermined formant component contained in a received sound signal in the case of the telephone voice call, and wherein;
   the signal level adjustment unit is arranged such that the received sound signal after adjustment processing of the predetermined formant component by the formant adjustment unit is the input signal.

8. An audio signal processing method, comprising at least:
   a step in which an environmental ambient noise level detection unit detects an environmental ambient noise level contained in an audio signal input through sound collection means for collecting a transmission sound at a time of a voice call;

a step in which a control signal generation unit generates a control signal for changing an input/output characteristic of a signal level adjustment unit from the environmental ambient noise level detected by the environmental ambient noise level detection, unit; and a step in which a received sound signal in the case of a telephone voice call is arranged to be an input signal, and a signal level adjustment unit (a) changes the input/output characteristic at a time of adjusting an output signal level with respect to an input signal level, and (b) adjusts a level of a predetermined formant component for the received sound signal by means of the control signal generated by the control signal generation unit, wherein the predetermined formant component has a frequency band which does not overlap with a peak of environmental ambient noise.

9. A communication terminal, comprising:

a communication unit for performing communications for a voice call at least;

a sound collection unit for collecting a transmission sound at a time of the voice call at least;

a sound output unit for converting a received sound signal at the time of the voice call into a sound wave to be output;

an environmental ambient noise level detection unit for detecting an environmental ambient noise level contained in an audio signal input through the sound collection unit;

a signal level adjustment unit which has (a) a level adjustment function to adjust a predetermined formant component for an output signal level with respect to an input signal level, and (b) an input/output characteristic change function to change an input/output characteristic when adjusting a level in the level adjustment function by means of a control signal, and in which a received sound signal in the case of a telephone voice call voice is arranged to be an input signal, wherein the predetermined formant component has a frequency band which does not overlap with a peak of environmental ambient noise; and a control signal generation unit for generating the control signal for changing the input/output characteristic of the signal level adjustment unit from the environmental ambient noise level detected by the environmental ambient noise level detection unit, wherein the received sound signal output from the signal level adjustment unit is supplied to the sound output unit.

10. The communication terminal according to claim 9, wherein, from the environmental ambient noise level, the control signal generation unit generates the control signal for changing the input/output characteristic of the signal level adjustment unit in a direction in which the output signal level increases with respect to the input signal level when a value of the environmental ambient noise level is higher than a specified value.

11. The communication terminal according to claim 9, wherein when a value of the environmental ambient noise level changes in a direction to decrease, the control signal generation unit generates, from the environmental ambient noise level, the control signal for changing the input/output characteristic of the signal level adjustment unit in a direction in which a relationship between the input signal level and the output signal level approaches one-to-one.

12. The communication terminal according to claim 9, wherein the signal level adjustment unit changes the input/output characteristic gradually or continuously by means of the control signal.

13. The communication terminal according to claim 9, wherein the environmental ambient noise level detection unit has a low pass filter which carries out low pass filtering of the audio signal input through the sound collection unit with a predetermined cutoff frequency, the control signal generation unit carries out envelope detection of the signal subjected to the low pass filtering by the low pass filter of the environmental ambient noise level detection unit, and generates the signal after the envelope detection as the control signal.

14. The communication terminal according to claim 9, wherein the signal level adjustment unit provides hysteresis for change of the input/output characteristic by a control signal.

15. The communication terminal according to claim 9, comprising:

a formant adjustment unit which emphasizes the predetermined formant component contained in a received sound signal in the case of the telephone voice call, and wherein;

the signal level adjustment unit is arranged such that the received sound signal after adjustment processing of the predetermined formant component by the formant adjustment unit is the input signal.

* * * * *